United States Patent
Nishikido

(10) Patent No.: US 6,803,831 B2
(45) Date of Patent: Oct. 12, 2004

(54) CURRENT STARVED INVERTER RING OSCILLATOR HAVING AN IN-PHASE SIGNAL TRANSMITTER WITH A SUB-THRESHOLD CURRENT CONTROL UNIT

(75) Inventor: Ryoji Nishikido, Kanagawa (JP)

(73) Assignee: NEC Eletronics Corporation, Kanagawa (JP)

(*) Notice: Subject to any disclaimer, the term of this patent is extended or adjusted under 35 U.S.C. 154(b) by 0 days.

(21) Appl. No.: 10/439,873

(22) Filed: May 16, 2003

(65) Prior Publication Data

US 2003/0214361 A1 Nov. 20, 2003

(30) Foreign Application Priority Data

May 20, 2002 (JP) .................................. 2002/145391

(51) Int. Cl.[7] ................................................ H03B 5/02
(52) U.S. Cl. ........................................... 331/57; 331/17
(58) Field of Search ......................... 331/57, 17, 117 R

(56) References Cited

U.S. PATENT DOCUMENTS

| | | | |
|---|---|---|---|
| 5,331,295 A | * | 7/1994 | Jelinek et al. ................ 331/57 |
| 6,211,744 B1 | * | 4/2001 | Shin ............................ 331/57 |
| 2002/0041215 A1 | * | 4/2002 | Kiyose ........................ 331/57 |
| 2002/0140504 A1 | * | 10/2002 | Hasegawa .................... 330/57 |

* cited by examiner

Primary Examiner—Robert Pascal
Assistant Examiner—Joseph Chang
(74) Attorney, Agent, or Firm—Scully, Scott, Murphy & Presser

(57) ABSTRACT

A ring oscillator according to the present invention comprises:

a ring oscillation unit, including
  a current starved inverter CSI having a current control P channel transistor P2, a signal transmission P channel transistor P3, a signal transmission N channel transistor N3 and a current control N channel transistor N2, and
  an in-phase signal transmitter receiving a signal from the current starved inverter, and outputting an in-phase signal to the current starved inverter; and a current control unit, including
  a basic current source having P channel transistor P10 and an N channel transistor N10 which is operated in a weak inversion state and flows a subthreshold current, and
  a current mirror circuit having a P channel transistor P12 current-mirror connected to the P channel transistors P10 and P2, and an N channel transistor N12 current-mirror connected to the N channel transistor N2.

20 Claims, 11 Drawing Sheets

| VDD(V) | 1.8V | 2.0V | 2.5V |
|---|---|---|---|
| CONDITION1 | 3.7MHz | 3.3MHz | 2.7MHz |
| CONDITION2 | 38.4MHz | 35.7MHz | 33.3MHz |
| INVERTER | 26.3MHz | 33.3MHz | 40.0MHz |

FIG. 4

| TEMPERATURE | −40°C | 150°C |
|---|---|---|
| VDD = 1.8V | 2.8MHz | 3.6MHz |
| VDD = 2.5V | 2.1MHz | 2.7MHz |

FIG. 6

CURRENT STARVED INVERTER RING OSCILLATOR HAVING AN IN-PHASE SIGNAL TRANSMITTER WITH A SUB-THRESHOLD CURRENT CONTROL UNIT

BACKGROUND OF THE INVENTION

1. Field of the Invention

The present invention relates to a ring oscillator, and in particular to a ring oscillator that prevents a reduction in an oscillation frequency due to a power voltage drop or a temperature rise.

2. Description of the Related Background Art

Recently, as the use of portable terminals or mobile products that employ batteries as power sources has spread, low-voltage operations have been requested even for integrated circuits in which non-volatile memory is mounted. Further, integrated circuits in which non-volatile memory is mounted are also used for vehicles, and in this case, there have been numerous requests for circuits that can function properly under high temperatures. In response to such requests, a booster circuit that generates high voltage for writing/erasing from externally supplied power source voltage is ordinarily mounted in non-volatile memory, and ring oscillators are commonly provided-as booster circuit constituents.

In a normal ring oscillator, wherein an odd number of CMOS inverters are connected to form a ring, the frequency of oscillation is reduced when the operating voltage is low or the temperature is high, and as a result of this reduction in the oscillation frequency, deterioration occurs in the capability of the booster circuit to produce and supply an output current, i.e., the capability of a power source to supply a current for the erasing of data from non-volatile memory and for the writing of data to non-volatile memory. Therefore, when the power voltage is low and the temperature is high, the periods required to write data to a memory cell and to erase data therefrom are extended, until in the worst case, data writing and erase are completely disabled. Therefore, to prevent a reduction in the capability of the booster circuit to supply a current, a ring oscillator is required that can maintain the oscillation frequency even when the power source voltage is low or the temperature is high.

A conventional example developed in response to this requirement is a voltage-controlled oscillator disclosed in U.S. Pat. No. 5,331,295.

FIG. 1 is a generalized circuit diagram of this conventional voltage-controlled oscillator, and FIG. 2 is a detailed circuit diagram showing the structure of the conventional voltage-controlled oscillator, excluding an oscillation unit.

In this conventional example, as is shown in FIG. 1, a voltage-controlled oscillator 40 comprises: an oscillation unit 52, wherein current starved inverters 115, which serve as delay cells, are provided at multiple steps in a cascade connection; a first current source 42, which is not affected by temperature and power voltage fluctuations; a second current source 44, for supplying a variable current that varies in accordance with the temperature and the power source provided voltage; an attenuator 46, for setting a current level for each cell in the oscillation unit 52; a reference voltage source 48; an input voltage node 50, for receiving an externally supplied control voltage; and a current mirror 110, connected between the attenuator 46 and the oscillation unit 52.

FIG. 2 depicts the detailed structures of the first current source 42, the second current source 44, the attenuator 46 and the current mirror 110, all of which are shown in FIG. 1.

In the conventional circuit, the current flowing across the first current source 42 is the total of the current received from the second current source 44 and the attenuator 46. The current received from the second *current source 44 is changed,in response to the temperature and the power voltage, whereas the current received from the first current source 42 is not affected by the temperature and the power voltage. Thus, the change in the current flowing across the attenuator 46 is the opposite of that produced by a change in the temperature and in the power source.

The oscillation frequency produced by the oscillation unit 52 is changed in accordance with the fluctuation in the temperature and in the power voltage. However, for the current starved inverters 115 of the delay cells that constitute the oscillation unit 52, the current level is set in accordance with the current supplied by the attenuator 46. Since the current flowing across the attenuator 46 is one for which the variation is the opposite of the current change that causes the temperature and the power voltage fluctuations, the oscillation frequency produced by the oscillation unit 52 does not depend on the temperature and the power voltage changes, and is determined only in accordance with a control voltage supplied by an input voltage node 50. Therefore, a stable voltage-controlled oscillator can be implemented.

As is described above, since the second current source, which supplies a variable current that is changed in accordance with the temperature and the power source voltage, is provided for the ring oscillator that is used for the conventional voltage-controlled oscillator in FIG. 1, temperature and power voltage fluctuations can be compensated for, and the oscillation frequency can be stabilized.

However, as is shown in FIG. 2, since the structure of the conventional voltage-controlled oscillator for the first current source 42 and the second current source 32 is complicated, and the size of the required layout is large, the dimensions of the integrated circuit chip and the manufacturing costs are increased. In addition, since as the resistance element constituting the reference voltage source 48 an accurate resistor is required that provides high resistance, this further increases the size of the layout.

SUMMARY OF THE INVENTION

To resolve these problems, it is one objective of the present invention to provide a ring oscillator that can prevent a reduction in the oscillation frequency when the power voltage drops or when the temperature rises, and that requires only a small layout.

According to the present invention, a ring oscillator comprises:

a current control unit, including a basic current source having a series circuit formed of a first P channel transistor, the drain and the gate of which are connected, and a first N channel transistor, the drain of which is connected to the drain of the first P channel transistor and which, to supply a sub-threshold current, is operated in a weak inversion state, a current mirror circuit having a series circuit formed of a second P channel transistor, the gate of which is connected to the drain of the first P channel transistor, a second N channel transistor, the drain and the gate of which are connected to the drain of the second P channel transistor; and a ring oscillation unit, including
a current starved inverter, having
a current control P channel transistor, the source of which is connected to the power source and the gate of which is connected to the drain of the first P channel transistor of the basic current source,
a signal transmission P channel transistor, the source of which is connected to the drain of the current control P channel transistor,
a signal transmission N channel transistor, the drain of which is connected to the drain of the signal transmission P channel transistor, and
a current control N channel transistor, the drain of which is connected to the source of the signal transmission N channel transistor, the gate of which is connected to the drain of the second N channel transistor of the current mirror circuit, and the source of which is grounded,
wherein a connection point of the gate of the signal transmission P channel transistor and the gate of the signal transmission N channel transistor serves as a signal input terminal, and a connection point of the drain of the signal transmission P channel transistor and the drain of the signal transmission N channel transistor serves as an output terminal for outputting an inverted signal; and
an in-phase signal transmitter for receiving an input signal from the output terminal of the current starved inverter, and for outputting, to the input terminal of the current starved inverter and to an external device, a signal having the same phase as the input signal.

The above and relevant objectives and features of the present invention will become apparent by referring to the subsequent description, which is based on the accompanying drawings, and other innovative matters represented by claims.

BRIEF DESCRIPTION OF THE DRAWINGS

To provide a better understanding of the drawings used for the following detailed explanation given for the present invention, a brief description of the drawings will now be given.

FIG. 4 is a diagram showing results obtained through a simulation of power source dependency of an oscillation frequency according to the present invention;

FIG. 6 is a diagram showing the results obtained by a temperature dependency simulation performed for the oscillation frequency of the first embodiment;

DETAILED DESCRIPTION OF THE PREFERRED EMBODIMENTS

The preferred embodiments of the present invention will now be described in detail while referring to the accompanying drawings. It should be noted, however, that the following explanation is given merely for the embodiments of the present invention, and that the present invention is not limited to these embodiments.

Figure 1:
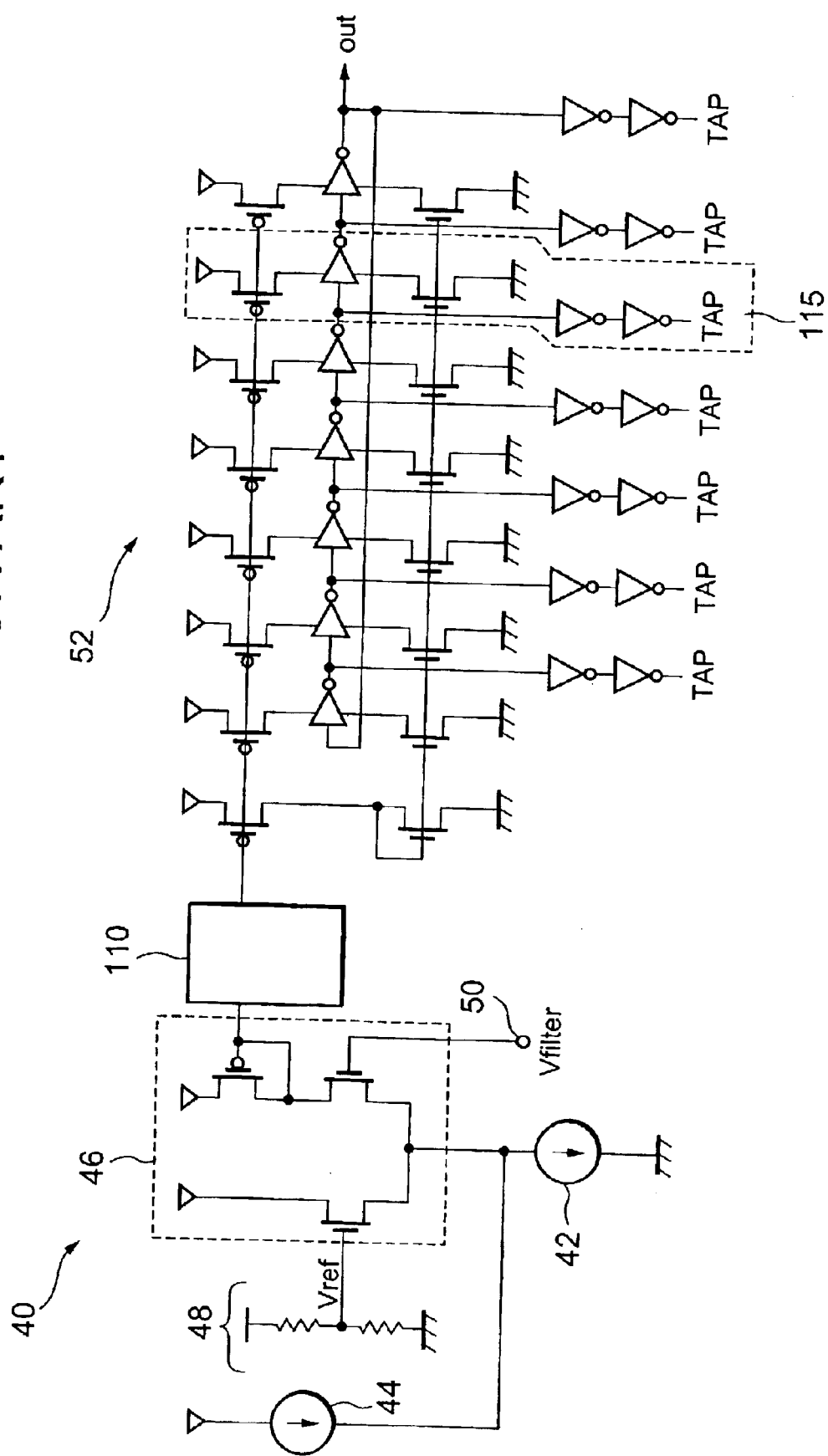
FIG. 1 is a generalized circuit diagram of a conventional voltage-controlled oscillator.
Figure 2:
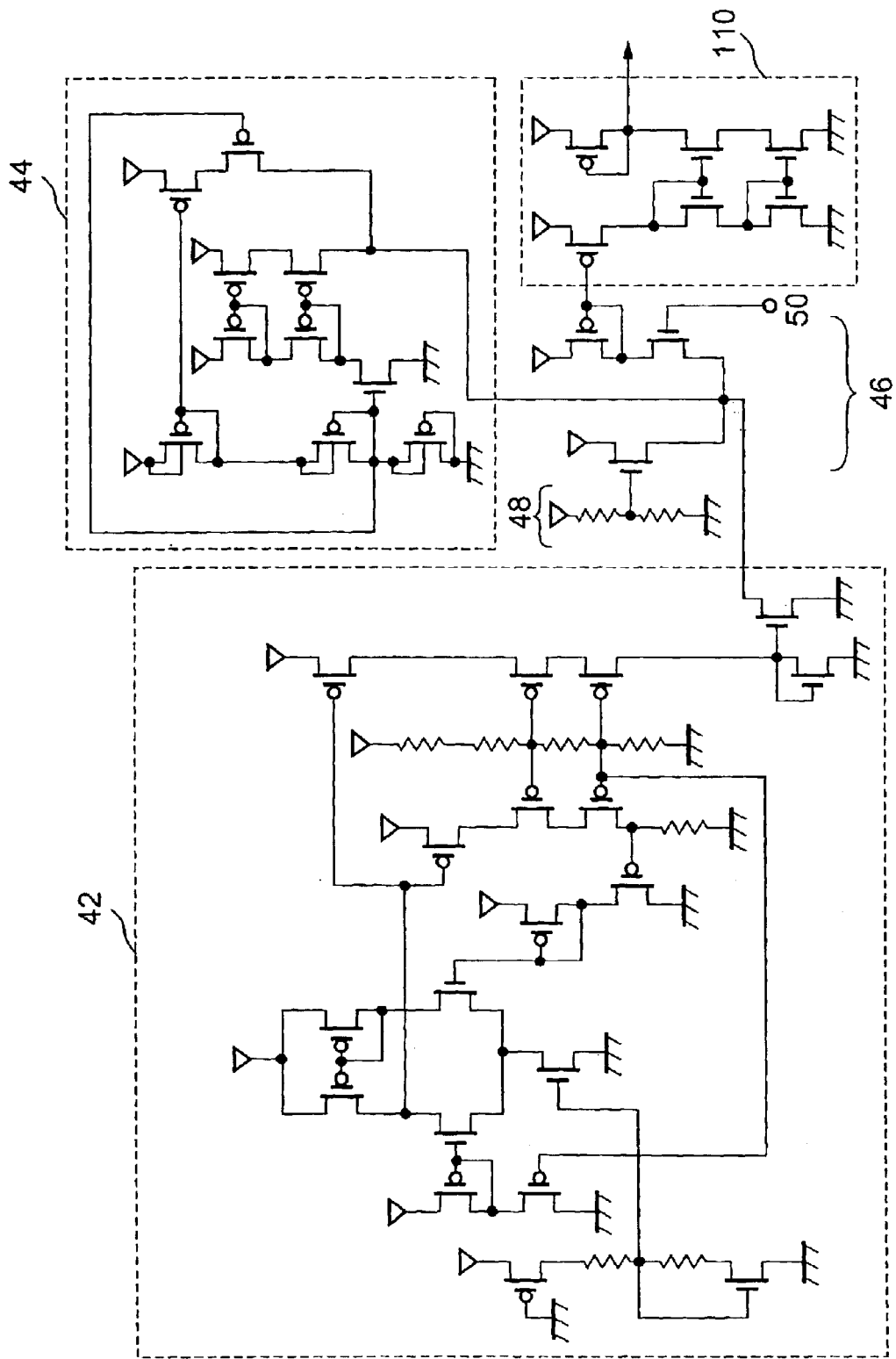
FIG. 2 is a detailed diagram showing the configuration, excluding an oscillation unit, of the circuit of the conventional voltage-controlled oscillator.
Figure 3:
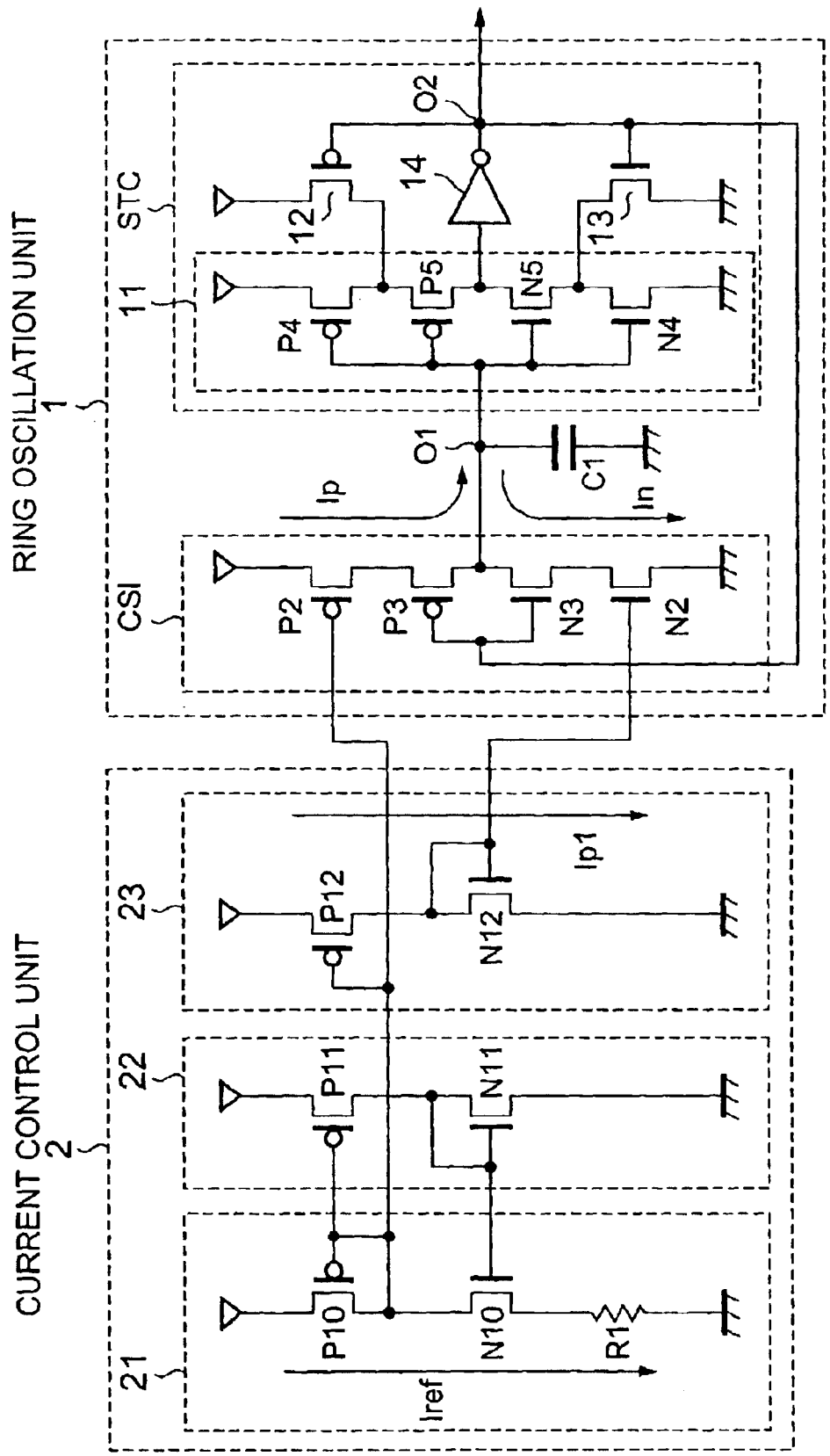
FIG. 3 is a circuit diagram showing a first embodiment of the present invention.
Figure 5:
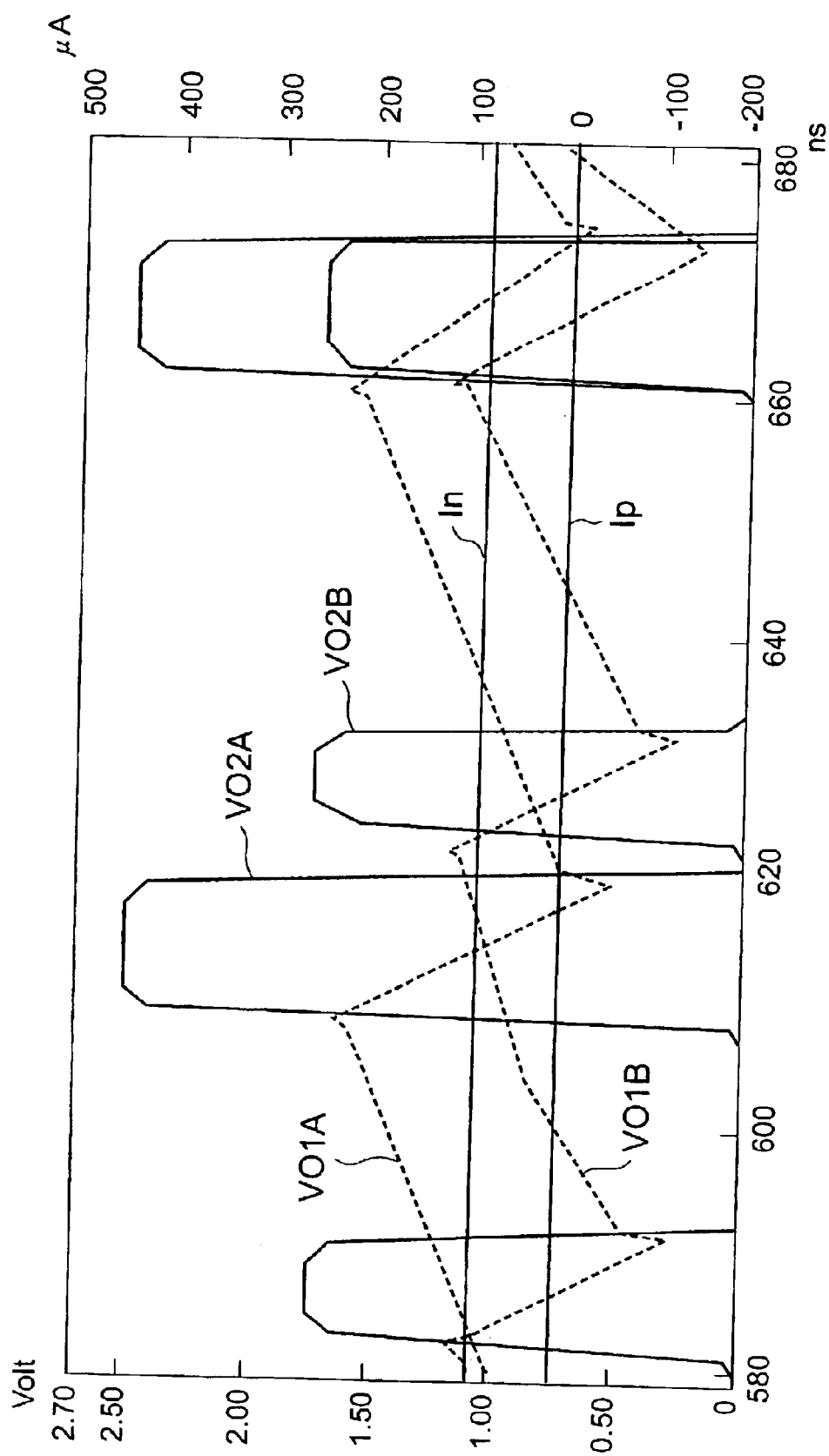
FIG. 5 is a diagram showing waveform simulation results obtained for the first embodiment.

FIG. 3 is a circuit diagram for a first embodiment of the present invention. FIG. 4 is a diagram showing the results obtained by a power voltage dependency simulation for an oscillation frequency of the embodiment. FIG. 5 is a diagram showing the results obtained by a waveform simulation for the embodiment. FIG. 6 is a diagram showing the results obtained by a temperature dependency simulation for the oscillation frequency for the embodiment.

A ring oscillator for this embodiment comprises an oscillation unit 1 and a current control unit 2, as is shown in FIG. 3.

The ring oscillation unit 1 includes a current starved inverter CSI a capacitor C1 and a Schmit trigger circuit STC.

The current starved inverter CSI includes: an inverter which has a signal transmission P channel transistor P3 and a signal transmission N channel transistor N3, wherein the gates of these transistors P3 and N3 are connected as input terminals and the drains thereof are connected as output terminals; and a current supplying P channel transistor P2 provided between a power source and the inverter; and a current supplying N channel transistor N2 provided between a ground terminal and the inverter.

The Schmit trigger circuit STC includes an inverter 11, a feedback P channel transistor 12, a feedback N channel transistor 13 and a CMOS inverter 14. The inverter 11 includes: a P channel transistor P4, the source of which is connected to the power source; a P channel transistor P5, the source of which is connected to the drain of the P channel transistor P4; an N channel transistor N5, the drain of which is connected to the drain of the P channel transistor P5; and an N channel transistor N4, the drain of which is connected to the source of the N channel transistor N5 and the source of which is grounded. The gate of the P channel transistor P4, the gate of the P channel transistor P5, the gate of the N channel transistor N5 and the gate of the N channel transistor N4 are connected in common to serve as input terminals for the inverter 11, and the connection point of the drain of the P channel transistor P5 and the drain of the N channel transistor N5 is used as the output terminal of the inverter 11. For the feedback P channel transistor 12, the source is connected to the power source, the gate is connected to the output terminal of the CMOS inverter 14, and the drain is connected to the drain of the P channel transistor P4. For the feedback N channel transistor 13, the source is grounded, the gate is connected to the output terminal of the CMOS inverter 14, and the drain is connected to the drain of the N channel transistor N4, while the input terminal of the CMOS inverter 14 is connected to the output terminal of the inverter 11. Since theoretically the Schmit trigger circuit STC is constituted by two inverter steps, the Schmit trigger circuit STC outputs an input signal as an in-phase signal.

In the ring oscillation unit 1, the output terminal of the current starved inverter CSI is connected through a node O1 to the input terminal of the inverter 11 in the Schmit trigger circuit STC, and the capacitor C1 is arranged between the node O1 and the ground terminal. Further, the output terminal of the CMOS inverter 14 for the Schmit trigger circuit STC is connected to the input terminal of the current starved inverter CSI through a node O2, which is also the output point for the ring oscillator.

The current control unit 2 includes a current source 21, a current source 22 and a current mirror circuit 23.

The current source 21, which is a basic current source, is so designed that a P channel transistor P10, the drain and the gate of which are connected, an N channel transistor N10 and a bias generating resistor R1 are arranged, in series, between the power source and the ground terminal. The bias generating resistor R1 generates a source potential of N channel transistor N10.

The current source 22, which is a second current source, is so designed that a P channel transistor P11, which is a current-mirror connected to the P channel transistor P10, and an N channel transistor N11, the drain and the gate of which are connected, are arranged, in series, between the power source and the ground terminal.

The current mirror circuit 23 is so designed that a P channel transistor P12, which is a current-mirror connected to the P channel transistor P10 and the P channel transistor P11 and which is a current-mirror connected to the P channel transistor P2 of the current starved inverter CSI, and an N channel transistor N12, the drain and the gate of which are connected, are provided, in series, between the power source and the ground terminal. The N channel transistor N12 is a current-mirror connected to the N channel transistor N2 of the current starved inverter CSI.

The operation of the ring oscillator according to the first embodiment will now be described while referring to FIGS. 3 to 6.

As is described above, the P channel transistors P10, P11 and P12 in the current control unit 2 constitute a current-mirror connected to the P channel transistor P2 of the ring oscillation unit 1, and the N channel transistor N12 is a current-mirror connected to the N channel transistor N2 of the ring oscillation unit 1.

Assume that Iref denotes a current that is supplied by the current source 21 and flows across the P channel transistor P10, the N channel transistor N10 and the bias generating resistor R1. Then, a current Ip11 flowing across the P channel transistor P11, a current Ip1 flowing across the P channel transistor P12, a current Ip flowing across the P channel transistor P2 and a current In flowing across the N channel transistor N2 are represented as follows.

$$Ip11 = Iref*gm(P11)/gm(P10) \quad (1)$$

$$Ip1 = Iref*gm(p12)/gm(P10) \quad (2)$$

$$Ip = Iref*gm(P2)/gm(P10) \quad (3)$$

$$In = Ip1*gm(N2)/gm(N12) \quad (4)$$

In this case, gm (P10), gm (P11), gm (P12), gm (P2), gm (n2) and gm (N12) respectively represent transconductances of P10, P11, P12, P2, N2 and N12. asterisk (*) means multiplication.

As is described above, the current Ip flowing across the P channel transistor P2 of the current starved inverter CSI and the current In flowing across the N channel transistor N2 are determined in accordance with the current flowing across the P channel transistor P10.

Since the same value is set as the transconductances for both of the P channel transistors P10 and P11, the current Ip11 flowing across the P channel transistor P11 is equal to Iref. For the N channel transistor N11, relative to the source level (0 V), the gate level is set to the level for the flow of the current Iref.

The source potential (potential at the connection point of the N channel transistor N10 and the bias generating resistor R1) of the N channel transistor N10 is defined as R1*Iref. In this case, the gate width of the N channel transistor N10 is set larger than that of the N channel transistor N11; however, only the same amount of current as is provided for the N channel transistor N11 is supplied to the N channel transistor N10.

Since the N channel transistor N10 is a current-mirror connected to the N channel transistor N11, the gate potential is the same as that for the N channel transistor N11, while the source potential is higher by R1*Iref than the source potential (0 V) for the N channel transistor N11. Therefore, a potential difference Vgs (N10), between the gate and the source of the N channel transistor N10, is smaller than a potential difference Vgs (N11), between the gate and the source of the N channel transistor N11.

That is, while no channel is formed for the N channel transistor N10, the N channel transistor N10 is operated in a weak inversion state wherein a subthreshold current is flowing. Thus, the current Iref is featured as a subthreshold current.

Therefore, the current Ip, which is flowing through the P channel transistor P2 of the current starved inverter CSI of the ring oscillation unit 1, reflects the subthreshold current characteristic of the current Iref supplied by the current source 21. Similarly, the current in, which is flowing through the N channel transistor N2 of the current starved inverter CSI, reflects the subthreshold current characteristic of the current Iref.

Since the subthreshold current of the MOS transistor that is operated in the weak inversion state depends little on the drain voltage, the current source 21 serves as a constant current source that is not affected by the power voltage. Further, in the strong inversion state, wherein the channel for the MOS transistor is formed, the current source has a negative temperature dependency according to which the amount of current is reduced as the temperature is raised; whereas, since the subthreshold current that flows through the MOS transistor in the weak inversion state is increased as the temperature is raised, the current source 21 has a positive temperature dependency.

Thus, the current Ip flowing across the P channel transistor P2 and the current In flowing across the N channel transistor N2 do not depend on the power voltage, and have a temperature dependency such that the amount of current is increased as the temperature is raised.

On the contrary, the Schmit trigger circuit STC provided for the ring oscillation unit 1 outputs an in-phase signal for an input signal, and a circuit threshold value VTH has a hysteresis characteristic relative to the change in the input signal. For the hysteresis operation, the Schmit trigger circuit STC feeds back the output of the inverter 11, inverted by the CMOS inverter 14, to the inverter 11 through the P channel transistor 12 and the N channel transistor 13.

When the input of the Schmit trigger circuit STC is changed from low to high, the level of the node O2 is low and the P channel transistor 12 is in the ON state. Therefore, the circuit threshold value VTH(L to H) of the Schmit trigger circuit STC is greater than the circuit threshold value of the inverter 11. Further, when the input for the Schmit trigger circuit STC is changed from high to low, the level of the node O2 is high and the N channel transistor 13 is in the ON state. Therefore, the circuit threshold value VTH(H to L) of the Schmit trigger circuit STC is smaller than the circuit threshold value of the inverter 11. That is, when the circuit threshold value of the inverter 11 is centrally located, between the middle of the power potential and the ground potential, and when the input level of the Schmit trigger circuit STC is changed from low to high, the circuit threshold value VTH(L to H) is located on the side above the middle level between the power potential and the ground potential. Then, when the level of the input is changed from high to low, the circuit threshold value VTR(H to L) is located on the side below the middle level between the power potential and the ground potential. Operation of the Schmit trigger circuit STC is performed with this hysteresis width.

Since the hysteresis width of the Schmit trigger circuit STC is extended as the power voltage is increased, the amplitude of the node O1, which is connected to the input terminal of the Schmit trigger circuit STC via the P channel transistor P3 and the N channel transistor N3, is also increased.

When Va denotes the voltage amplitude of a node O1, and Cc1 denotes the capacitance of the capacitor connected to the node O1, a charging period Tc and a discharge period Td for the capacitor C1 are determined using the following equations.

$$Tc = Cc1 * Va/Ip \quad (5)$$

$$Td = Cc1 * Va/In \quad (6)$$

Therefore, when the power voltage is lowered while the temperature remains constant, the voltage amplitude of the node O1 is reduced, while the currents Ip and In are not changed. Thus, the charging/discharging periods for the capacitor C1 are reduced, and the oscillation frequency for the ring oscillation unit 1 is increased.

When the temperature is raised while the power voltage remains constant, the voltage amplitude of the node O1 is not changed and the values of the currents Ip and In are increased. Thus, the charging/discharging periods for the capacitor C1 are reduced, and the oscillation frequency for the ring oscillation unit 1 is increased.

Therefore, according to the ring oscillator of this embodiment, while a special power voltage compensation circuit is not required, a reduction in the oscillation frequency due to a lowering in the power voltage can be prevented, and without a special temperature compensation circuit being required, a reduction fin the oscillation frequency due to a rise in the temperature can be prevented.

FIG. 4 is a diagram showing the results obtained by a simulation performed for the operation of the ring oscillator of this embodiment. According to these results, when a constant temperature is maintained, under both condition 1 (second column in FIG. 4) and condition 2 (third column in FIG. 4), the oscillation frequency increases as the power voltage is lowered.

The condition 1 represents a case wherein a reference voltage Vref=1.23 V and Cc1=2 pF at the gate of the N channel transistor N10 of the current source 21, and wherein a resistor with the resistance of R=500 KΩ is provided between the output terminal of the current starved inverter CSI and the node O1. The condition 2 represents a case wherein Vref=1.23 V, Cc1=0 and R=0.

The values entered in the fourth column in FIG. 4 represent the results obtained by a simulation performed under condition 2, while the Schmit trigger circuit STC in FIG. 3 is replaced by two, serially connected, CMOS inverter steps.

Since Cc 1=0 and R=0, according to the condition in the fourth column wherein the Schmit trigger circuit is replaced by the CMOS inverters, only small effects are obtained by operating the N channel transistor N10 in the weak inversion state. And since the Schmit trigger circuit is not present, the oscillation frequency is reduced as the power voltage drops. This is because, when the Schmit trigger circuit is not employed, the operating speed of the CMOS inverter dominates the frequency oscillated by the ring oscillator. That is, as the power voltage is dropped, the inversion speed of the CMOS inverter is reduced, and accordingly, the oscillation frequency is lowered.

On the contrary, when the Schmit trigger circuit STC is employed, the hysteresis width is reduced as the power voltage is lowered. Therefore, so long as the increase in the oscillated frequency due to the reduction in the hysteresis width is set so it is larger than the reduction in the oscillation frequency due to a lowering in the power voltage, the effects shown in the second and third columns in FIG. 4 can be obtained.

Under the condition 1 in the second column, the effects obtained by operating the N channel transistor N10 in the weak inversion state and the effects obtained by reducing the hysteresis width of the Schmit trigger circuit STC are obtained, so that the increase in the oscillation frequency due to a lowering in the power voltage is the greatest.

According to the condition 2 in the third column, the effects obtained by reducing the hysteresis width of the Schmit trigger circuit STC are dominant, so that an increase in the oscillation frequency due to a reduction in the power voltage is not as great as it is under the condition 1.

Though not shown in FIG. 4, when the Schmit trigger circuit STC is replaced with two CMOS inverters serially connected, and when the CMOS inverters are operated when R=500 KΩ, as well as in the condition 1, the characteristic of the current starved inverter becomes the predominant characteristic, exceeding that of the CMOS inverter, as the Cc1 is increased. Thus, the positive voltage dependency of the oscillated frequency is reduced. The negative voltage dependency of the oscillation frequency can also be established by setting a very large value for the Cc1. It should be noted, however, that the oscillation frequency is reduced when a large value is set for Cc1.

FIG. 5 is a graph showing the results obtained by a waveform simulation performed during the operation simulation shown in FIG. 4. In FIG. 5, VO1A represents the voltage waveform for the node O1 and VO2A represents a voltage waveform for the node O2 when the power voltage is 2.5 V. VO1B represents the voltage waveform for the node O1 and VO2B represents a voltage waveform for the node O2 when the power voltage is 1.8 V. For the current Ip, the current waveform at the power voltage of 2.5 V overlaps the current waveform at the power voltage of 1.8 V, and for the current In, the current waveform at the power voltage of 2.5 V overlap the current waveform at the power voltage of 1.8 V.

As is shown in FIG. 5, even when the power voltage is changed, there is no change in the currents Ip and In for the charging or the discharging of the node O1. Further, the voltage amplitude of the node O1 is reduced as the power voltage is lowered.

Therefore, whether the equations (5) and (6), representing the operation of the ring oscillator in this embodiment, are proper can be confirmed using the simulation results shown in FIG. 5.

FIG. 6 is a diagram showing the results obtained by a temperature dependency simulation performed for the ring oscillator having the circuit configuration in FIG. 3.

As is shown in FIG. 6, both when the power voltage is high (second column) and when the power voltage is low (third column), the oscillation frequency increases as the temperature is raised.

As is described above, according to the ring oscillator in this embodiment, without a special power voltage compensation circuit being required, the reduction in the oscillation frequency for the ring oscillator can be prevented when the power voltage is lowered. Further, without a special temperature compensation circuit being required, a reduction in the oscillation frequency for the ring oscillator can be prevented when the temperature is raised. In addition, since these effects can be obtained by increasing the element dimensions until they are equivalent in size to several transistors, a high-performance ring oscillator can be provided for which the layout is small. For the simulations shown in FIGS. 4 to 6, the resistor of R=500 KΩ has been additionally provided between the output terminal of the current starved inverter CSI and the capacitor C1. However, when the gate width of the current control P channel transistor P2 of the current starved inverter CSI and the gate width of the current control N channel transistor N2 are appropriately set, as is shown in FIG. 3, this resistance R is not required FIG. 7 is a circuit diagram showing the configuration of a ring oscillator according to a second embodiment of the present invention.

Figure 7:
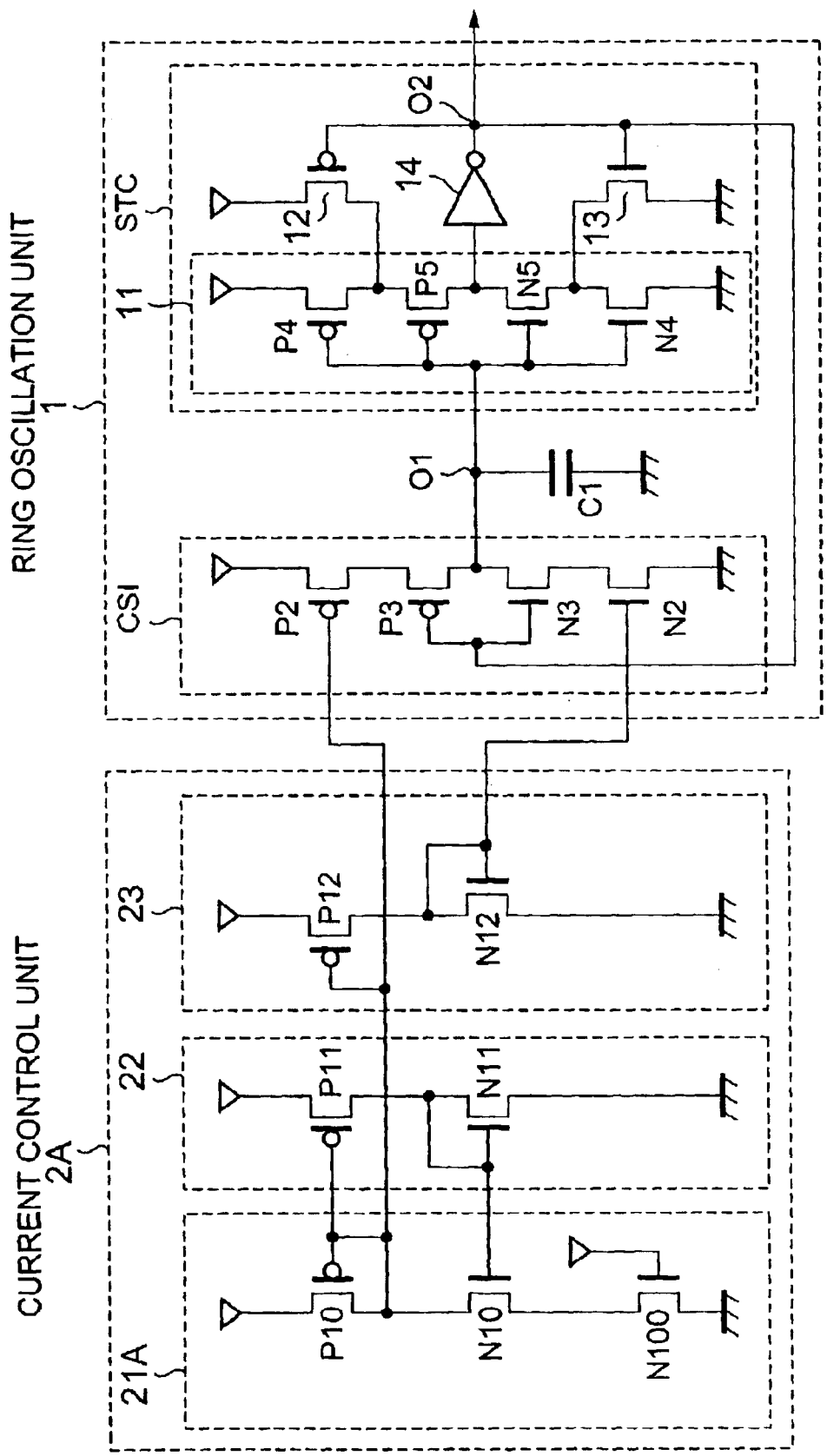
FIG. 7 is a circuit diagram showing a second embodiment of the present invention.

As is shown in FIG. 7, the ring oscillator in this embodiment comprises a ring oscillation unit 1 and a current control unit 2A.

The configuration of the ring oscillation unit 1 is the same as that for the first embodiment in FIG. 3.

The current control unit 2A includes a current source 21A, a current source 22 and a current mirror circuit 23, and the current source 22 and the current mirror circuit 23 are the same as those for the first embodiment in FIG. 3.

The current source 21A includes a P channel transistor P10, an N channel transistor N10 and an N channel transistor N100, which are connected in series between a power source and a ground terminal.

The ring oscillator in this embodiment differs from the ring oscillator in the first embodiment in FIG. 3 in that the current source 21A includes, instead of the bias generating resistor R1, the N channel transistor N100, the gate of which is connected to the power source.

The operation of the N channel transistor N100 is the same as that of the bias generating resistor R1 in the first embodiment. However, since the element dimension can be reduced compared with the dimension required by the bias generating resistor R1, the layout dimension of the ring oscillator can be reduced.

As is described above, according to the ring oscillator in this embodiment, the same effects as in the first embodiment can be obtained, and the layout dimension can be reduced compared with that for the first embodiment.

Figure 8:
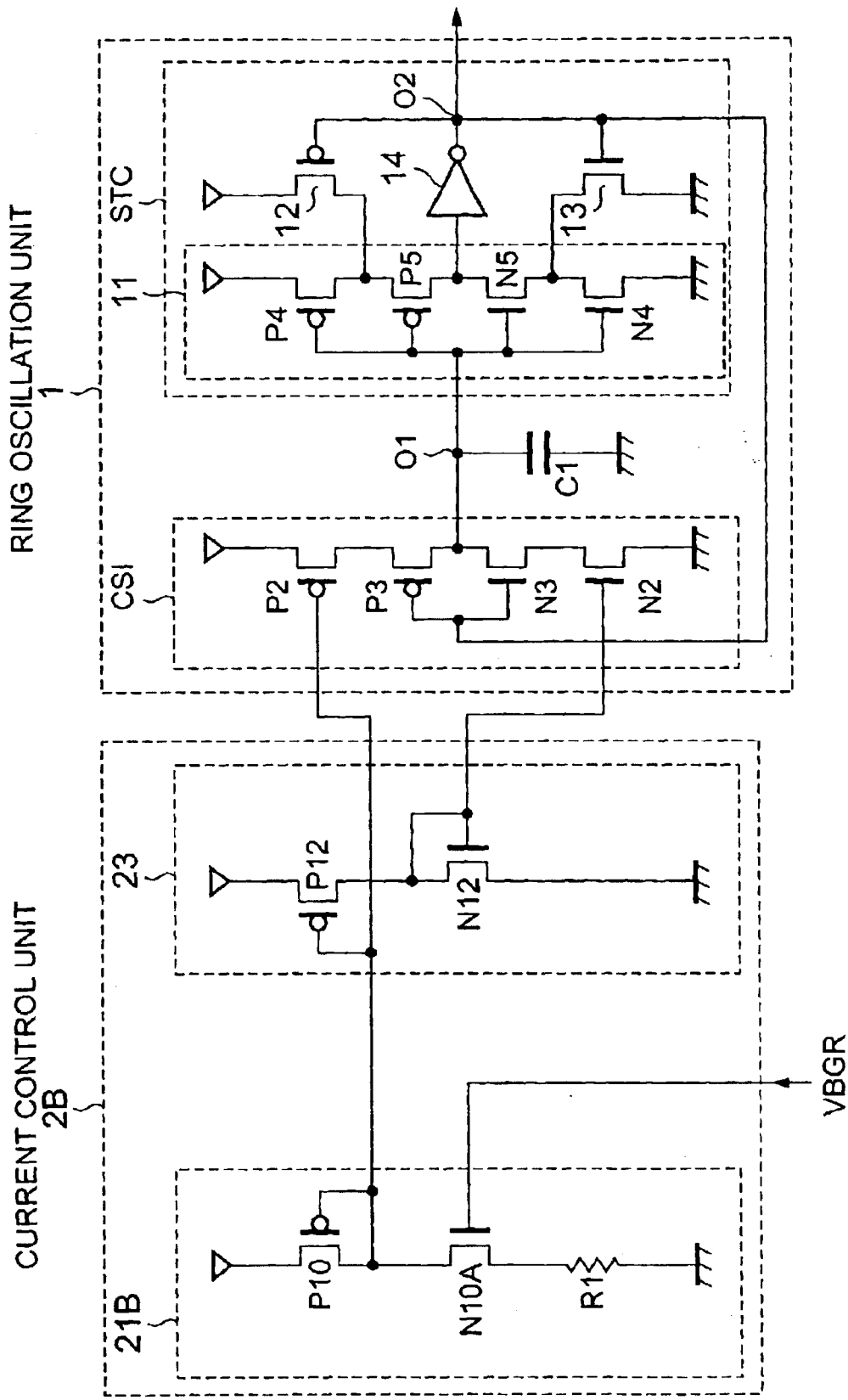
FIG. 8 is a circuit diagram showing a third embodiment of the present invention.

FIG. 8 is a circuit diagram showing the configuration of a ring oscillator according to a third embodiment of the present invention.

As is shown in FIG. 8, the ring oscillator in this embodiment includes a ring oscillation unit 1 and a current control unit 2B.

The configuration of the ring oscillation unit 1 is the same as that for the first embodiment in FIG. 3.

The current control unit 2B includes a current source 21B and a current mirror circuit 23, which is the same as that for the first embodiment in FIG. 3.

In this embodiment, unlike the first embodiment, the current source 22 is not provided. Further, while a P channel transistor P10 of the current source 21B and a bias generating resistor R1 are the same as the current source 21 in the first embodiment, the third embodiment differs from the first embodiment in that a reference voltage VBGR is applied to the gate of an N channel transistor N10A by a bandgap reference circuit (BGR circuit) (not shown).

The BGR circuit is constituted based on a well known band theory, and it is known that the reference voltage VBGR generated by this circuit does not change in accordance with the power voltage or the temperature.

Therefore, for an integrated circuit in which the BGR circuit is mounted, the reference voltage VBGR is supplied by the BGR circuit to the gate of the N channel transistor N10 of the current source 21B. With this configuration, the P channel transistor P11 and the N channel transistor N11 of the first embodiment are not required, and the layout dimension of the ring oscillator can be reduced.

As is described above, according to the ring oscillator of this embodiment, the same effects as in the first embodiment can be obtained, and the layout dimensions can be reduced more compared with those for the first embodiment.

Figure 9:
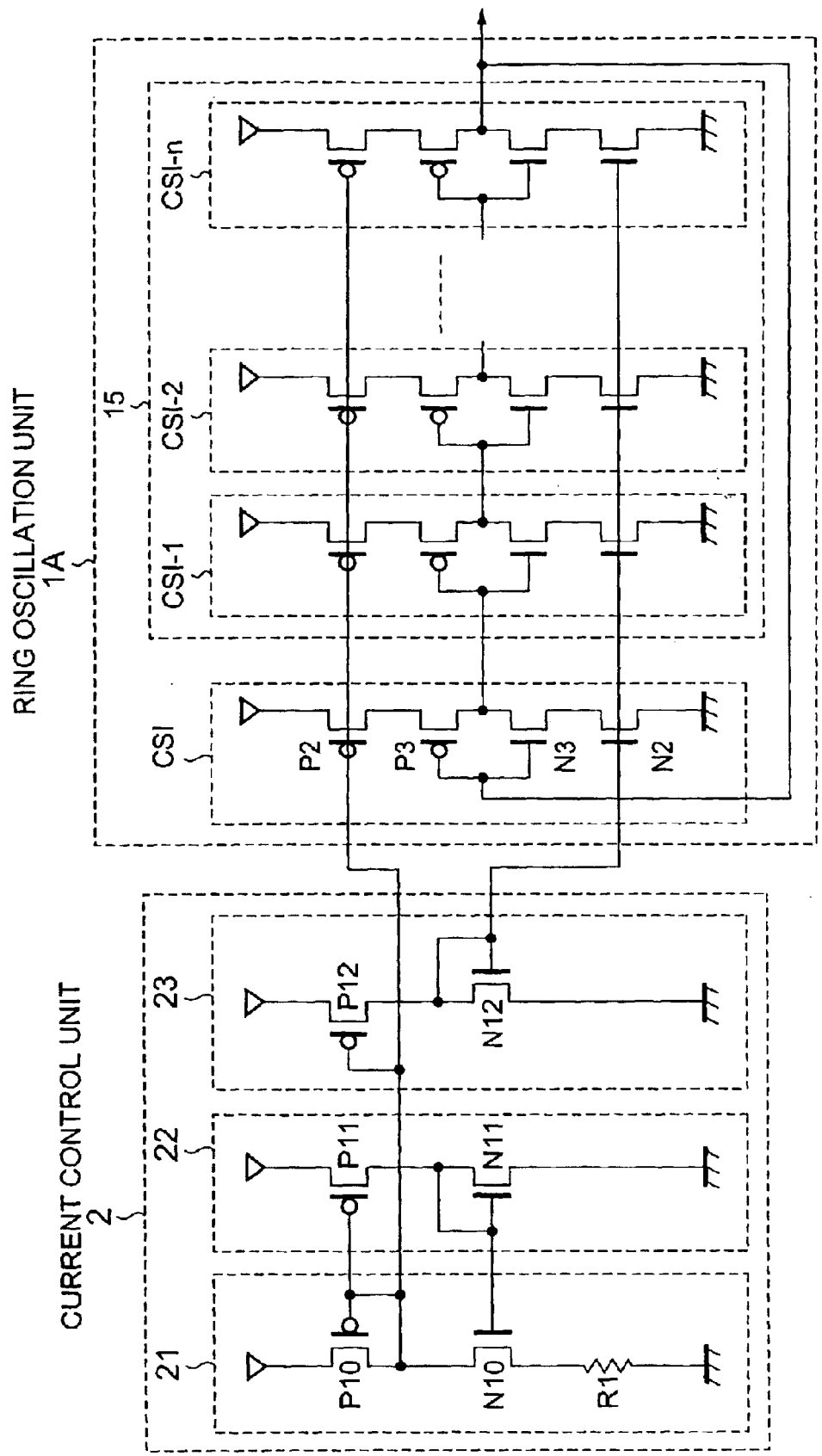
FIG. 9 is a circuit diagram showing a fourth embodiment of the present invention.

FIG. 9 is a circuit diagram showing the configuration of a ring oscillator according to a fourth embodiment of the present invention.

As is shown in FIG. 9, the ring oscillator in this embodiment comprises a ring oscillation unit 1A and a current control unit 2.

The configuration of the current control unit 2 is the same as that for the first embodiment in FIG. 3.

The ring oscillation unit 1A is so designed that a current starved inverter group 15, including n current starved inverters CSI-1 to CSI-n (n is an even number) connected serially, and a current starved inverter CSI are connected like a ring.

Among these inverters, the current starved inverter CSI is the same as that for the first embodiment in FIG. 3.

The current starved inverter group 15 includes an even number of current starved inverters which are the same as the current starved inverter CSI, and the output terminal of each current starved inverter is connected to the input terminal of a succeeding current starved inverter The output of the current starved inverter is transmitted, and the in-phase signal of the input signal of the current starved inverter group 15 is output. The current starved inverter group 15 receives a signal from the output terminal of the current starved inverter CSI, and feeds back the output to the input terminal of the current starved inverter CSI. In this manner, the operation of the ring oscillator is performed.

For this embodiment, the frequency oscillated by the ring oscillator is determined by the sum of the delay time of the current starved inverter group 15 and the delay time of the current starved inverter CSI. Therefore, like the other embodiments, a resistor and a capacitor need not be provided for the node O1 to determine an oscillated frequency, so that the layout of the ring oscillator can be reduced.

As is described above, according to the ring oscillator for this embodiment, the same effects as in the first embodiment can be obtained, and the layout dimension can be reduced more compared with in the other embodiments.

Figure 10:
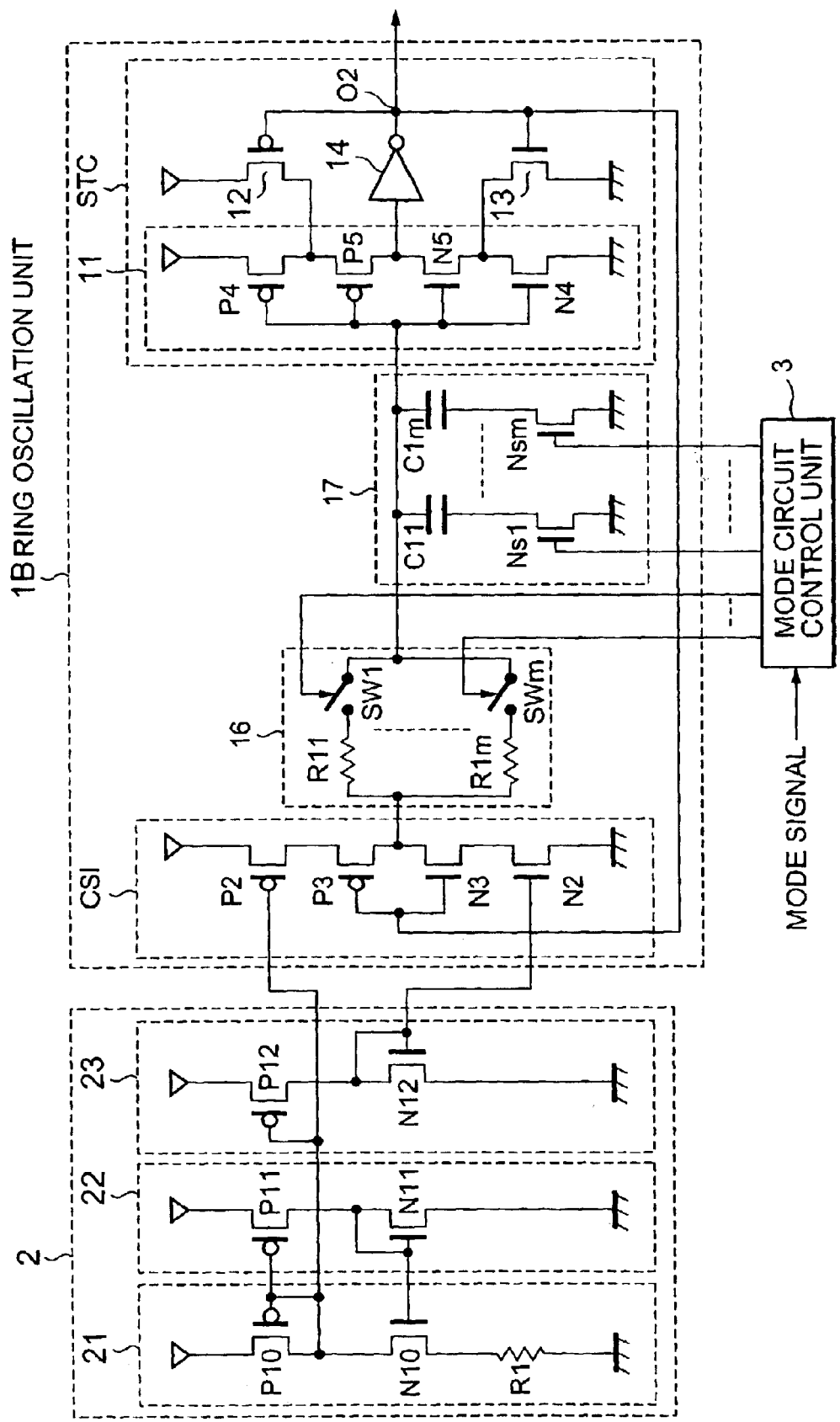
FIG. 10 is a circuit diagram showing a fifth embodiment of the present invention.

FIG. 10 is a circuit diagram showing the configuration of a ring oscillator according to a fifth embodiment of the present invention.

As is shown in FIG. 10, the ring oscillator in this embodiment comprises: a ring oscillation unit 1B, a current control unit 2 and a mode circuit control unit 3.

The configuration of the current control unit 2 is the same as that for the first embodiment.

The ring oscillation unit 1B is so designed that a Schmit trigger circuit STC and a current starved inverter CSI are connected like a ring, and includes: a resistance setting circuit 16 provided between the output terminal of the current starved inverter CSI and the input terminal of the Schmit trigger circuit STC; and a capacitance setting circuit 17 provided between the input terminal of the Schmit trigger circuit STC and the ground terminal. The resistance setting circuit 16 includes m (m is an integer of two or greater) series circuits where a resistor and a switching element are connected in series, and these series circuits (R11, SW1) to (R1m, SWm) are connected in parallel. The capacitance setting circuit 17 includes m series circuits where a capacitance and an N channel transistor are connected in series, and these series circuits (C11, Ns1) to (C1m, Nsm) are connected in parallel. The switching elements and the N channel transistors are selectively turned on or off by a mode circuit control unit 3 in accordance with a mode signal.

According to the ring oscillator for this embodiment, one of the resistors included in the resistance setting circuit 16 is selected in accordance with a mode signal received by the mode circuit control unit 3, and is inserted between the output terminal of the current starved inverter CSI and the input terminal of the Schmit trigger circuit STC. Further, in accordance with a mode signal received by the mode circuit control unit 3, one of the capacitors included in the capacitance setting circuit 17 is selected and is inserted between the input terminal of the Schmit trigger circuit STC and the ground terminal. As a result, the frequency oscillated by the ring oscillator can be controlled for each mode.

Therefore, according to the ring oscillator in this embodiment, an optimal oscillated frequency can be selected for each mode.

The mode in this case is an operating mode for a flash memory or an EEPROM (Electrical Erasable Programmable Read Only Memory), such as a write mode, an erase mode, or a read mode.

Since only a small amount of current supplied by a booster circuit is sufficient depending on the operating mode, in this case, the oscillated frequency can be lowered to reduce power consumption. The ring oscillator for this embodiment enables the selection of a predetermined oscillated frequency in accordance with a mode signal at each time.

As is described above, according to the ring oscillator for this embodiment, the same effects as in the first embodiment can be obtained, and since the oscillated frequency is controlled in accordance with an external mode signal, the optimal oscillated frequency can be obtained for each mode.

Figure 11:
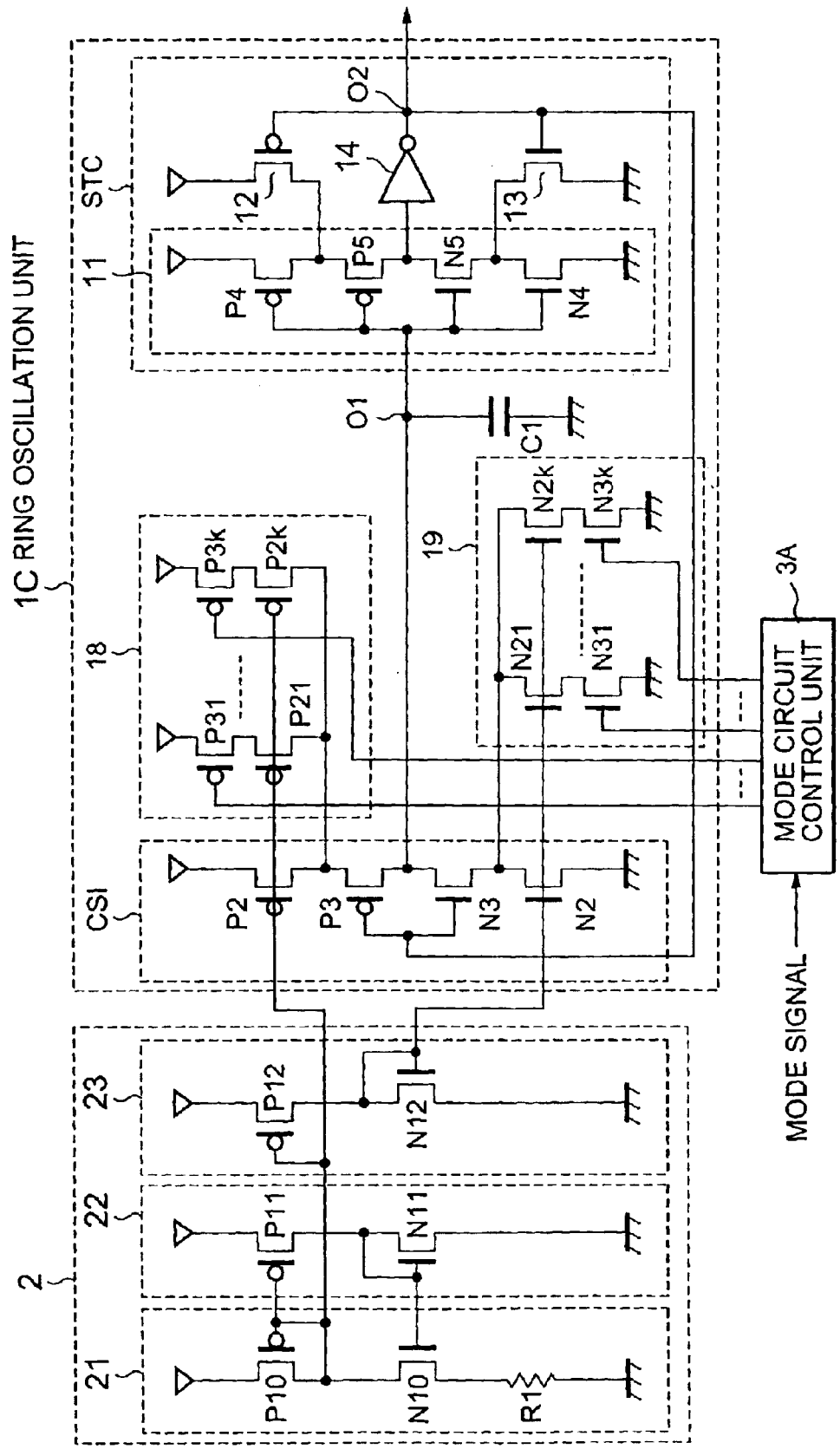
FIG. 11 is a circuit diagram showing a sixth embodiment of the present invention.

FIG. 11 is a circuit diagram showing the configuration of a ring oscillator according to a sixth embodiment of the present invention.

As is shown in FIG. 11, the ring oscillator in this embodiment comprises: a ring oscillation unit 1C, a current control unit 2 and a mode circuit control unit 3A.

The configuration of the current control unit 2 is the same as that for the first embodiment in FIG. 3.

The ring oscillation unit 1C is composed of a Schmit trigger circuit STC and the current starved inverter CSI and includes: a current supplying P channel transistor selector 18, which is located between a power source and the drain of a P channel transistor P2 in a current starved inverter CSI,; and a current supplying N channel transistor selector 19, which is located between the ground terminal and the drain of an N channel transistor N2 of the current starved inverter CSI. The current supplying P channel transistor selector 18 includes k (an integer of 1 or greater) series circuits where two P channel transistors are connected in series, and these series circuits (P31, P21) to (P3k, P2k) are connected in parallel. The P channel transistors P31 to P3k are turned on or off in accordance with a select signal received from a mode circuit control unit 3A. The P channel transistors P21 to P2k, as well as the P channel transistor P2 of the current starved inverter CSI, are current-mirror connected to the P channel transistor P10 of a current source 21. The current supplying N channel transistor selector 19 includes k series circuits where two N channel transistors are connected in series, and these series circuits (N31, N21) to (N3k, N2k) are connected in series. The N channel transistors N31 to N3k are turned on or off in accordance with a select signal received from the mode circuit control unit 3A. The N channel transistors N21 to N2k, as well as the N channel transistor N2 of the current starved inverter CSI, are current-mirror connected to the N channel transistor N12 of a current source 23.

According to the ring oscillator in this embodiment, the P channel transistors, which are current-mirror connected to the P channel transistor P2 of the current starved inverter CSI, and the N channel transistors, which are current-mirror connected to the N channel transistor N2, are controlled by the mode circuit control unit 3A in accordance with a mode signal. Then, when the amount of current that flows across the P channel transistor P3 and the N channel transistor N3 of the current starved inverter CSI are changed, the speed for charging and discharging the capacitor C1 connected to the node O1 can be changed. Therefore, the frequency oscillated by the ring oscillator can be controlled for each mode.

Therefore, according to the ring oscillator in this embodiment, as well as in the fifth embodiment, the optimal oscillated frequency can be selected for each mode.

As is described above, according to the ring oscillator in this embodiment, the same effects as in the first embodiment can be obtained, and when the states of the transistors are controlled in accordance with an external mode signal, the optimal oscillated frequency can be obtained for each mode.

The embodiments of the present invention have been explained in detail while referring to the accompanying drawings. However, a specific configuration is not limited to these, and various designs can be included in this invention without departing from the scope of the subject of the invention. For example, a ring oscillator may be provided by an arbitrary combination of the ring oscillation unit and the current control unit in each embodiment. Further, in the third to the sixth embodiments, the bias generating resistor R1 may be replaced with an N channel transistor as in the second embodiment. In addition, in the fourth embodiment, an arbitrary even number of current starved inverters may be employed to constitute the current starved inverter group 15. Furthermore, in the fifth embodiment, an arbitrary integer of two or greater may be employed as the number of pairs of series circuits, each formed of a resistor and a switching circuit, and series circuit, each formed of a capacitor and an N channel transistor. Further, in the sixth embodiment, an arbitrary integer of one or greater may be employed as the number of pairs of series circuits, each formed of two P channel transistors, and series circuits, each formed of two N channel transistors.

As is described above, according to the ring oscillator in this invention, without special power voltage compensation circuit being required, the reduction of a frequency oscillated by the ring oscillator due to the drop of the power voltage can be prevented. In addition, without a special temperature compensation circuit being required, the reduction of a frequency oscillated by the ring oscillator due to the rise of the temperature can be prevented. Further, since the element dimension at this time is less increased, the high-performance ring oscillator with a small layout dimension can be provided.

What is claimed is:

1. A ring oscillator comprising:
   a current control unit, including
      a basic current source having a series circuit formed of a first P channel transistor, the drain and the gate of which are connected, and a first N channel transistor, the drain of which is connected to the drain of the first P channel transistor and which, to supply a sub-threshold current, is operated in a weak inversion state, and
      a current mirror circuit having a series circuit formed of a second P channel transistor, the gate of which is connected to the drain of the first P channel transistor, a second N channel transistor, the drain and the gate of which are connected to the drain of the second P channel transistor; and
   a ring oscillation unit, including
      a current starved inverter, having
         a current control P channel transistor, the source of which is connected to the power source and the gate of which is connected to the drain of the first P channel transistor of the basic current source,
         a signal transmission P channel transistor, the source of which is connected to the drain of the current control P channel transistor,
         a signal transmission N channel transistor, the drain of which is connected to the drain of the signal transmission P channel transistor, and
         a current control N channel transistor, the drain of which is connected to the source of the signal transmission N channel transistor, the gate of which is connected to the drain of the second N channel transistor of the current mirror circuit, and the source of which is grounded,
         wherein a connection point of the gate of the signal transmission P channel transistor and the gate of the signal transmission N channel transistor serves as a signal input terminal, and a connection point of the drain of the signal transmission P channel transistor and the drain of the signal transmission N channel transistor serves as an output terminal for outputting an inverted signal; and
      an in-phase signal transmitter for receiving an input signal from the output terminal of the current starved inverter, and for outputting, to the input terminal of the current starved inverter and to an external device, a signal having the same phase as the input signal.

2. A ring oscillator according to claim 1, wherein, in the basic current source of the current control unit, the first P channel transistor, the first N channel transistor and a resistor are connected in series between a power source and a ground terminal; and wherein a bandgap reference voltage is applied to the gate of the first N channel transistor.

3. A ring oscillator according to claim 1,
   wherein the current control unit further includes a second current source constituted by a series connection, between the power source and the ground terminal, a third P channel transistor, the gate of which is connected to the drain of the first P channel transistor, and a third N channel transistor, the drain and the gate of which are connected to the gate of the first N channel transistor; and
   wherein the basic current source is constituted by a series connection, between the power source and the ground terminal, the first P channel transistor, the first N channel transistor and a bias generating resistor.

4. A ring oscillator according to claim 1,
   wherein the current control unit further includes a second current source constituted by a series connection, between the power source and the ground terminal, a third P channel transistor, the gate of which is connected to the drain of the first P channel transistor, and a third N channel transistor, the drain and the gate of which are connected to the gate of the first N channel transistor; and
   wherein the basic current source is constituted by a series connection, between the power source and the ground terminal, the first P channel transistor, the first N channel transistor and a fourth N channel transistor, the gate of which is connected to the power source.

5. A ring oscillator according to claim 1,
   wherein the ring oscillation unit further includes a capacitor provided between the output terminal of the current starved inverter and the ground terminal; and
   wherein the in-phase signal transmitter consists of a Schmit trigger circuit, for outputting an in-phase signal of an input signal, a circuit threshold value of which represents a hysteresis characteristic relative to the change of an input signal.

6. A ring oscillator according to claim 5, wherein, in the basic current source of the current control unit, the first P channel transistor, the first N channel transistor and a bias generating resistor are connected in series between a power source and a ground terminal; and wherein a bandgap reference voltage is applied to the gate of the first N channel transistor.

7. A ring oscillator according to claim 5,
   wherein the current control unit further includes a second current source constituted by a series connection, between the power source and the ground terminal, a third P channel transistor, the gate of which is connected to the drain of the first P channel transistor, and a third N channel transistor, the drain and the gate of which are connected to the gate of the first N channel transistor; and
   wherein the basic current source is constituted by a series connection, between the power source and the ground terminal, the first P channel transistor, the first N channel transistor and a bias generating resistor.

8. A ring oscillator according to claim 5,
   wherein the current control unit further includes a second current source constituted by a series connection, between the power source and the ground terminal, a third P channel transistor, the gate of which is connected to the drain of the first P channel transistor, and a third N channel transistor, the drain and the gate of which are connected to the gate of the first N channel transistor; and
   wherein the basic current source is constituted by a series connection, between the power source and the ground terminal, the first P channel transistor, the first N channel transistor and a fourth N channel transistor, the gate of which is connected to the power source.

9. A ring oscillator according to claim 1, wherein the in-phase signal transmitter consists of a current starved inverter group including an even number of current starved inverters connected in series.

10. A ring oscillator according to claim 9, wherein, in the basic current source of the current control unit, the first P channel transistor, the first N channel transistor and a bias generating resistor are connected in series between a power source and a ground terminal; and wherein a bandgap reference voltage is applied to the gate of the first N channel transistor.

11. A ring oscillator according to claim 9,
wherein the current control unit further includes a second current source constituted by a series connection, between the power source and the ground terminal, a third P channel transistor, the gate of which is connected to the drain of the first P channel transistor, and a third N channel transistor, the drain and the gate of which are connected to the gate of the first N channel transistor; and
wherein the basic current source is constituted by a series connection, between the power source and the ground terminal, the first P channel transistor, the first N channel transistor and a bias generating resistor.

12. A ring oscillator according to claim 9,
wherein the current control unit further includes a second current source constituted by a series connection, between the power source and the ground terminal, a third P channel transistor, the gate of which is connected to the drain of the first P channel transistor, and a third N channel transistor, the drain and the gate of which are connected to the gate of the first N channel transistor; and
wherein the basic current source is constituted by a series connection, between the power source and the ground terminal, the first P channel transistor, the first N channel transistor and a fourth N channel transistor, the gate of which is connected to the power source.

13. A ring oscillator comprising:
a current control unit, including
a basic current source having a series circuit formed of a first P channel transistor, the drain and the gate of which are connected, and a first N channel transistor, the drain of which is connected to the drain of the first P channel transistor and which, to supply a sub-threshold current, is operated in a weak inversion state,
current mirror circuit having a series circuit formed of a second P channel transistor, the gate of which is connected to the drain of the first P channel transistor, a second N channel transistor, the drain and the gate of which are connected to the drain of the second P channel transistor; and
a ring oscillation unit, including
a current starved inverter, having
a current control P channel transistor, the source of which is connected to the power source and the gate of which is connected to the drain of the first P channel transistor of the basic current source,
a signal transmission P channel transistor, the source of which is connected to the drain of the current control P channel transistor,
a signal transmission N channel transistor, the drain of which is connected to the drain of the signal transmission P channel transistor, and
a current control N channel transistor, the drain of which is connected to the source of the signal transmission N channel transistor, the gate of which is connected to the drain of the second N channel transistor of the current mirror circuit, and the source of which is grounded,
a Schmit trigger circuit, for outputting an in-phase signal of an input signal, a circuit threshold value of which represents a hysteresis characteristic relative to the change of the input signal, and the output terminal of which is connected to the input terminal of the current starved inverter
a resistance setting circuit, located between the output terminal of the current starved inverter and the input terminal of the Schmit trigger circuit, and formed of a parallel connection of multiple series circuits, each having a resistor and a switching element, and
capacitance setting circuit, located between the input terminal of the Schmit trigger circuit and the ground terminal, and formed of a parallel connection of multiple series circuits, each having a capacitor and a switching element.

14. A ring oscillator according to claim 13, wherein, in the basic current source of the current control unit, the first P channel transistor, the first N channel transistor and a bias generating resistor are connected in series between a power source and a ground terminal; and wherein a bandgap reference voltage is applied to the gate of the first N channel transistor.

15. A ring oscillator according to claim 13,
wherein the current control unit further includes a second current source constituted by a series connection, between the power source and the ground terminal, a third P channel transistor, the gate of which is connected to the drain of the first P channel transistor, and a third N channel transistor, the drain and the gate of which are connected to the gate of the first N channel transistor; and
wherein the basic current source is constituted by a series connection, between the power source and the ground terminal, the first P channel transistor, the first N channel transistor and a bias generating resistor.

16. A ring oscillator according to claim 13,
wherein the current control unit further includes a second current source constituted by a series connection, between the power source and the ground terminal, a third P channel transistor, the gate of which is connected to the drain of the first P channel transistor, and a third N channel transistor, the drain and the gate of which are connected to the gate of the first N channel transistor; and
wherein the basic current source is constituted by a series connection, between the power source and the ground terminal, the first P channel transistor, the first N channel transistor and a fourth N channel transistor, the gate of which is connected to the power source.

17. A ring oscillator according to claim 1, wherein the ring oscillation unit further includes
a capacitor located between the output terminal of the current starved inverter and the ground terminal,
a current supplying P channel transistor selector, including at least one series circuit formed of a current supplying P channel transistor, which is located between the power source and the drain of the current control P channel transistor in the current starved inverter and the gate of which is connected to the drain of the first P channel transistor in the basic current source, and a switching P channel transistor, for receiving a select signal at the gate, and
a current supplying N channel transistor selector, including at least one series circuit formed of a current supplying N channel transistor, which is located between the ground terminal and the drain of the current control N channel transistor in the current starved inverter and the gate of which is connected to the drain of the second N channel transistor in the current mirror circuit, and a switching N channel transistor, for receiving a select signal at the gate;

wherein the in-phase signal transmitter consists of a Schmit trigger circuit, for outputting an in-phase signal of san input signal, the circuit threshold value of which represents a hysteresis characteristic relative to the change of the input signal.

18. A ring oscillator according to claim 17, wherein, in the basic current source of the current control unit, the first P channel transistor, the first N channel transistor and a bias generating resistor are connected in series between a power source and a ground terminal; and wherein a bandgap reference voltage is applied to the gate of the first N channel transistor.

19. A ring oscillator according to claim 17, wherein the current control unit further includes a second current source constituted by a series connection, between the power source and the ground terminal, a third P channel transistor, the gate of which is connected to the drain of the first P channel transistor, and a third N channel transistor, the drain and the gate of which are connected to the gate of the first N channel transistor; and wherein the basic current source is constituted by a series connection, between the power source and the ground terminal, the first P channel transistor, the first N channel transistor and a bias generating resistor.

20. A ring oscillator according to claim 17, wherein the current control unit further includes a second current source constituted by a series connection, between the power source and the ground terminal, a third P channel transistor, the gate of which is connected to the drain of the first P channel transistor, and a third N channel transistor, the drain and the gate of which are connected to the gate of the first N channel transistor; and wherein the basic current source is constituted by a series connection, between the power source and the ground terminal, the first P channel transistor, the first N channel transistor and a fourth N channel transistor, the gate of which is connected to the power source.

* * * * *